United States Patent
Matsuoka

(10) Patent No.: US 10,760,766 B2
(45) Date of Patent: Sep. 1, 2020

(54) FLOODLIGHT DEVICE WITH TWO OPTICAL SYSTEMS THAT CONDENSE AND COLLIMATE LASER LIGHT

(71) Applicant: USHIO DENKI KABUSHIKI KAISHA, Tokyo (JP)

(72) Inventor: Tomomi Matsuoka, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/312,442

(22) PCT Filed: Jun. 5, 2017

(86) PCT No.: PCT/JP2017/020766
§ 371 (c)(1),
(2) Date: Dec. 21, 2018

(87) PCT Pub. No.: WO2018/003409
PCT Pub. Date: Jan. 4, 2018

(65) Prior Publication Data
US 2019/0242553 A1   Aug. 8, 2019

(30) Foreign Application Priority Data

Jun. 30, 2016 (JP) ................................ 2016-130719
Jun. 30, 2016 (JP) ................................ 2016-130732

(51) Int. Cl.
*F21V 5/00* (2018.01)
*F21V 11/08* (2006.01)
(Continued)

(52) U.S. Cl.
CPC ............... *F21V 5/008* (2013.01); *F21V 7/26* (2018.02); *F21V 7/28* (2018.02); *F21V 9/35* (2018.02);
(Continued)

(58) Field of Classification Search
CPC . F21V 9/30; F21V 13/14; F21V 13/08; F21V 13/12; F21V 5/008
See application file for complete search history.

(56) References Cited

U.S. PATENT DOCUMENTS 9,109,771 B2 * 8/2015 Takahashi ............... F21S 41/16
9,255,672 B2 * 2/2016 Weichmann .......... F21V 29/505
(Continued)

FOREIGN PATENT DOCUMENTS

JP   S58-075704 A   5/1983
JP   2008-218386 A   9/2008
(Continued)

OTHER PUBLICATIONS

Notification of Transmittal of Translation of the International Preliminary Report on Patentability and Translation of Written Opinion of the International Searching Authority; PCT/JP2017/020766; dated Jan. 10, 2019.
(Continued)

*Primary Examiner* — Robert J May
(74) *Attorney, Agent, or Firm* — Studebaker & Brackett PC

(57) ABSTRACT

A floodlight device comprises a light-emitting element that emits laser light, a fluorescent element on which light emitted from the light-emitting element is incident and which converts at least a portion of said light into fluorescent light that is output therefrom, a first optical system on which light output from the fluorescent element is incident, and a second optical system on which light exiting the first optical system is incident and which causes said light to be made into a collimated light beam that is made to exit therefrom so as to be directed toward the exterior of the device, a
(Continued)

divergence angle of light incident on the second optical system is greater than a divergence angle of light incident on the first optical system.

13 Claims, 4 Drawing Sheets

(51) Int. Cl.
| | | |
|---|---|---|
| *H01S 5/02* | (2006.01) | |
| *G02B 19/00* | (2006.01) | |
| *F21V 9/35* | (2018.01) | |
| *F21V 29/67* | (2015.01) | |
| *F21V 21/30* | (2006.01) | |
| *F21V 14/06* | (2006.01) | |
| *F21V 7/26* | (2018.01) | |
| *F21V 7/28* | (2018.01) | |
| *F21V 29/76* | (2015.01) | |
| *F21V 29/83* | (2015.01) | |
| *F21V 15/01* | (2006.01) | |
| *F21Y 115/30* | (2016.01) | |
| *F21Y 115/10* | (2016.01) | |

(52) U.S. Cl.
CPC .............. *F21V 11/08* (2013.01); *F21V 14/06* (2013.01); *F21V 15/01* (2013.01); *F21V 21/30* (2013.01); *F21V 29/67* (2015.01); *F21V 29/763* (2015.01); *F21V 29/83* (2015.01); *G02B 19/00* (2013.01); *H01S 5/02* (2013.01); *F21Y 2115/10* (2016.08); *F21Y 2115/30* (2016.08)

(56) References Cited

U.S. PATENT DOCUMENTS

| 9,869,454 | B2 * | 1/2018 | Kim ........................ F21V 13/04 |
| 9,885,813 | B2 * | 2/2018 | Yamanaka ......... G03B 21/2013 |
| 10,060,613 | B2 * | 8/2018 | Qin ..................... F21V 21/0824 |
| 10,247,381 | B2 * | 4/2019 | Tsuda ...................... F21S 45/47 |
| 2008/0247177 | A1 | 10/2008 | Tanaka et al. |
| 2013/0314937 | A1 | 11/2013 | Takahashi et al. |
| 2015/0309235 | A1 | 10/2015 | Kawaguchi et al. |
| 2016/0109627 | A1 * | 4/2016 | Yamanaka ......... G03B 21/2013 |
| | | | 362/84 |
| 2017/0241631 | A1 * | 8/2017 | Bessho ................ F21V 29/502 |
| 2017/0363278 | A1 | 12/2017 | Furuuchi et al. |

FOREIGN PATENT DOCUMENTS

| JP | 2009-021135 | A | 1/2009 |
| JP | 2010-080364 | A | 4/2010 |
| JP | 2013-246943 | A | 12/2013 |
| JP | 2014-011118 | A | 1/2014 |
| JP | 2014-222708 | A | 11/2014 |
| JP | 2015-210890 | A | 11/2015 |
| JP | 2016-097339 | A | 5/2016 |
| WO | 2015-001693 | A1 | 1/2015 |

OTHER PUBLICATIONS

International Search Report issued in PCT/JP2017/020766; dated Sep. 5, 2017.

An Office Action mailed by the Japanese Patent Office dated Nov. 13, 2019, which corresponds to Japanese Patent Application No. 2016-130732 and is related to U.S. Appl. No. 16/312,442; with English language translation.

An Office Action mailed by the Japanese Patent Office dated Mar. 27, 2020, which corresponds to Japanese Patent Application No. 2016-130732 and is related to U.S. Appl. No. 16/312,442.

* cited by examiner

«FLOODLIGHT DEVICE WITH TWO OPTICAL SYSTEMS THAT CONDENSE AND COLLIMATE LASER LIGHT»

TECHNICAL FIELD

The present invention relates to a floodlight device comprising light-emitting element(s) that emit laser light.

BACKGROUND ART

Conventionally known as floodlight devices are floodlight devices in which the light source is a discharge lamp (e.g., Patent Literature 1) and floodlight devices in which the light source is an LED (e.g., Patent Literature 2 and 3). It so happens that the life of discharge lamps is typically short, and the output of LEDs (intensity, illuminance, etc.) is typically low.

CITATION LIST

Patent Literature

Patent Literature 1: JP-A-S58-75704
Patent Literature 2: JP-A-2014-11118
Patent Literature 3: JP-A-2014-222708

SUMMARY OF THE INVENTION

Technical Problem

The problem is therefore to provide a floodlight device comprising light-emitting element(s) that emit laser light.

Solution to Problem

There is provided a floodlight device, which includes:
a light-emitting element that emits laser light;
a fluorescent element on which light emitted from the light-emitting element is incident and which converts at least a portion of said light into fluorescent light that is output therefrom;
a first optical system on which light output from the fluorescent element is incident; and
a second optical system on which light exiting the first optical system is incident and which causes said light to be made into a collimated light beam that is made to exit therefrom so as to be directed toward the exterior of the device;
wherein a divergence angle of light incident on the second optical system is greater than a divergence angle of light incident on the first optical system.

Further, the floodlight device may include a configuration in which:
the first optical system is a condensing optical system that causes light which is incident thereon to exit therefrom as a convergent light beam; and
the second optical system is arranged at a location separated from the first optical system in such fashion as to cause light exiting the first optical system to be a divergent light beam when incident on the second optical system.

Further, the floodlight device may further include:
a light blocking body that blocks light that is output from the fluorescent element and that is directed at the second optical system without having passed through the first optical system;
wherein the light blocking body comprises an optical path unit for allowing light that exits the first optical system to pass therethrough and be incident on the second optical system.

Further, the floodlight device may include a configuration in which:
the optical path unit is arranged at a location of a focus of the first optical system; and
a locus of the optical path unit is larger than an optical output locus of the fluorescent element.

Further, the floodlight device may include a configuration in which:
the light blocking body comprises a reflecting layer at a surface thereof.

Further, the floodlight device may further include:
a first casing that houses at least the light-emitting element; and
a second casing that houses at least the second optical system;
wherein volume at the interior of the first casing is less than volume at the interior of the second casing; and
hermeticity of the first casing is greater than hermeticity of the second casing.

Further, the floodlight device may include a configuration in which:
at least a portion of the first casing is arranged at the interior of the second casing.

Further, the floodlight device may further include:
a heat dissipating unit that causes heat produced by the light-emitting element to be discharged to the exterior of the first casing;
wherein the heat dissipating unit is arranged at the exterior of the second casing.

Further, the floodlight device may include a configuration in which:
the second casing comprises an open portion for allowing circulation of air between the interior of the second casing and the exterior of the second casing; and
the open portion is arranged so as to face the direction of gravity.

Further, there is provided a floodlight device, which includes:
a solid-state light source element that emits light;
an optical element on which light emitted from the solid-state light source element is incident and which causes said light to exit therefrom so as to be directed toward the exterior of the device;
a first casing that houses the solid-state light source element; and
a second casing that houses the optical element;
wherein volume at the interior of the first casing is less than volume at the interior of the second casing; and
hermeticity of the first casing is greater than hermeticity of the second casing.

Advantageous Effect of the Invention

As described above, the floodlight device provides the excellent benefit that it comprises light-emitting element(s) that emit laser light.

DESCRIPTION OF EMBODIMENTS

Figure 1:
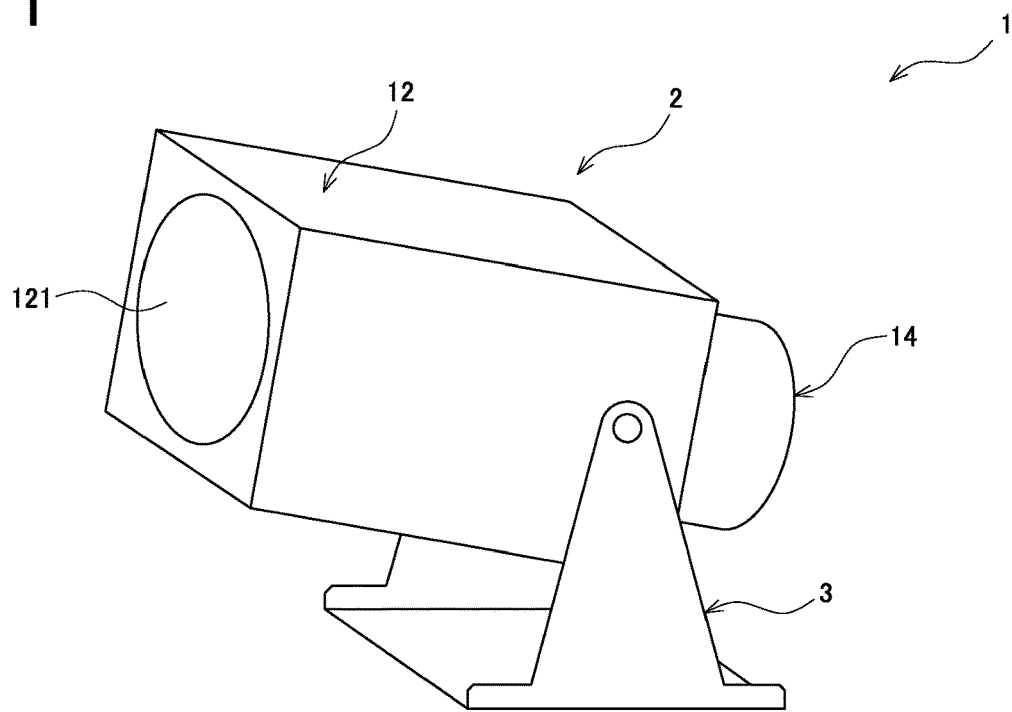
FIG. 1 is a drawing which is a full view of a floodlight device associated with an embodiment and which is a drawing showing a situation such as might exist when the light projected therefrom is directed diagonally upward.

Below, an embodiment of a floodlight device is described with reference to FIG. 1 through FIG. 5. At the respective drawings, note that dimensional ratios in the drawings and actual dimensional ratios are not necessarily consistent, and note further that dimensional ratios are not necessarily consistent from drawing to drawing.

Figure 2:
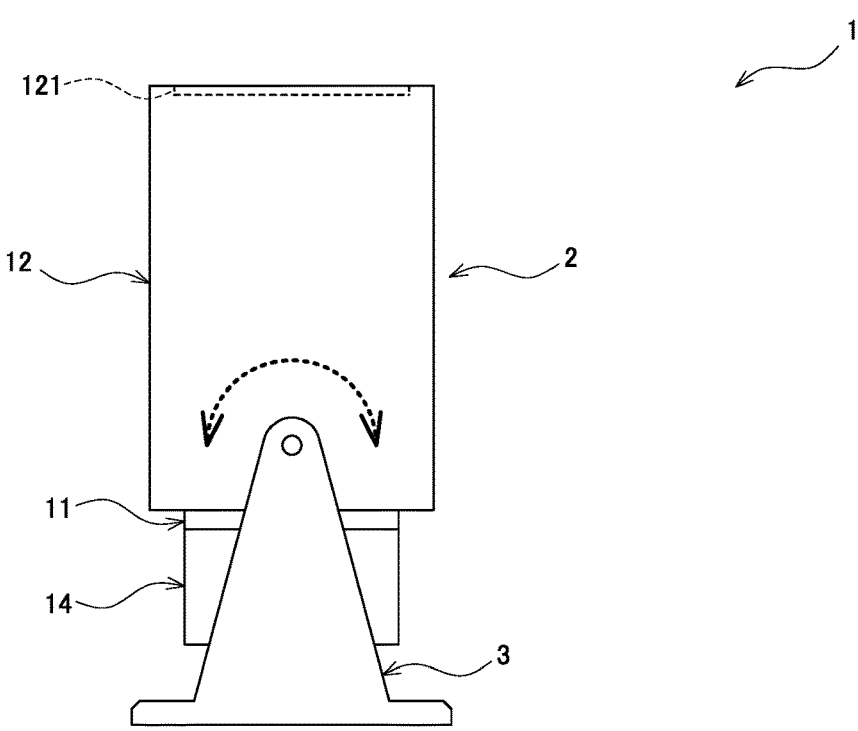
FIG. 2 is a drawing which is a full view of a floodlight device associated with same embodiment and which is a drawing showing a situation such as might exist when the light projected therefrom is directed straight up.

As shown in FIG. 1 and FIG. 2, floodlight device 1 associated with the present embodiment comprises device main body 2 which causes light to be projected from light projecting unit 121 to the exterior, and support 3 which rotatably supports device main body 2 and which is secured to a concrete foundation or other such secured object. For example, if support 3 is secured to a secured object that is parallel to the horizontal, floodlight device 1 may cause light to be projected therefrom so as to be directed diagonally upward (in a direction that forms an angle of less than 180° with the vertical) as shown in FIG. 1, or may cause light to be projected therefrom so as to be directed straight up (in the vertical direction) as shown in FIG. 2.

Figure 3:
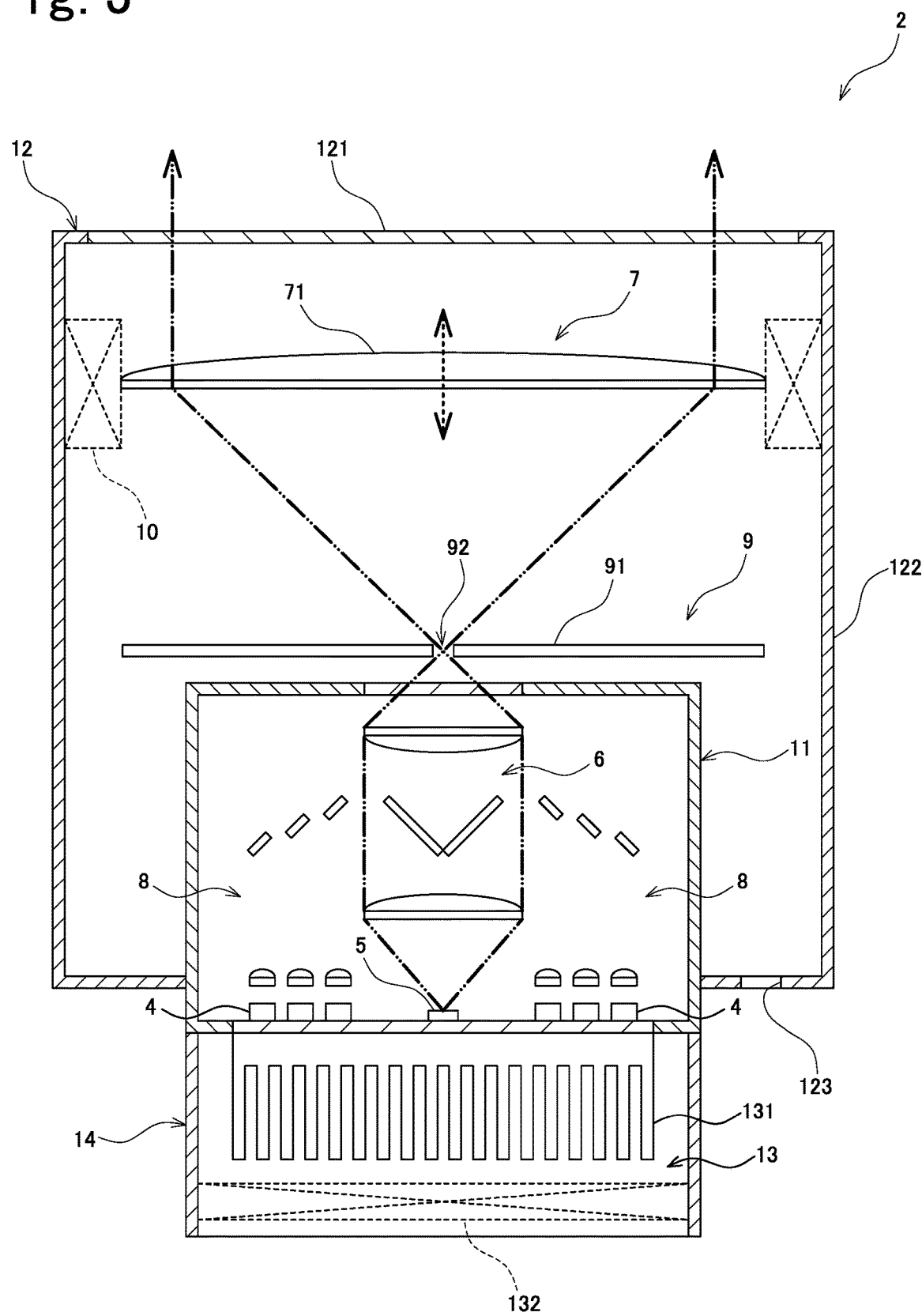
FIG. 3 is an interior view of overall device of floodlight device associated with same embodiment.
Figure 4:
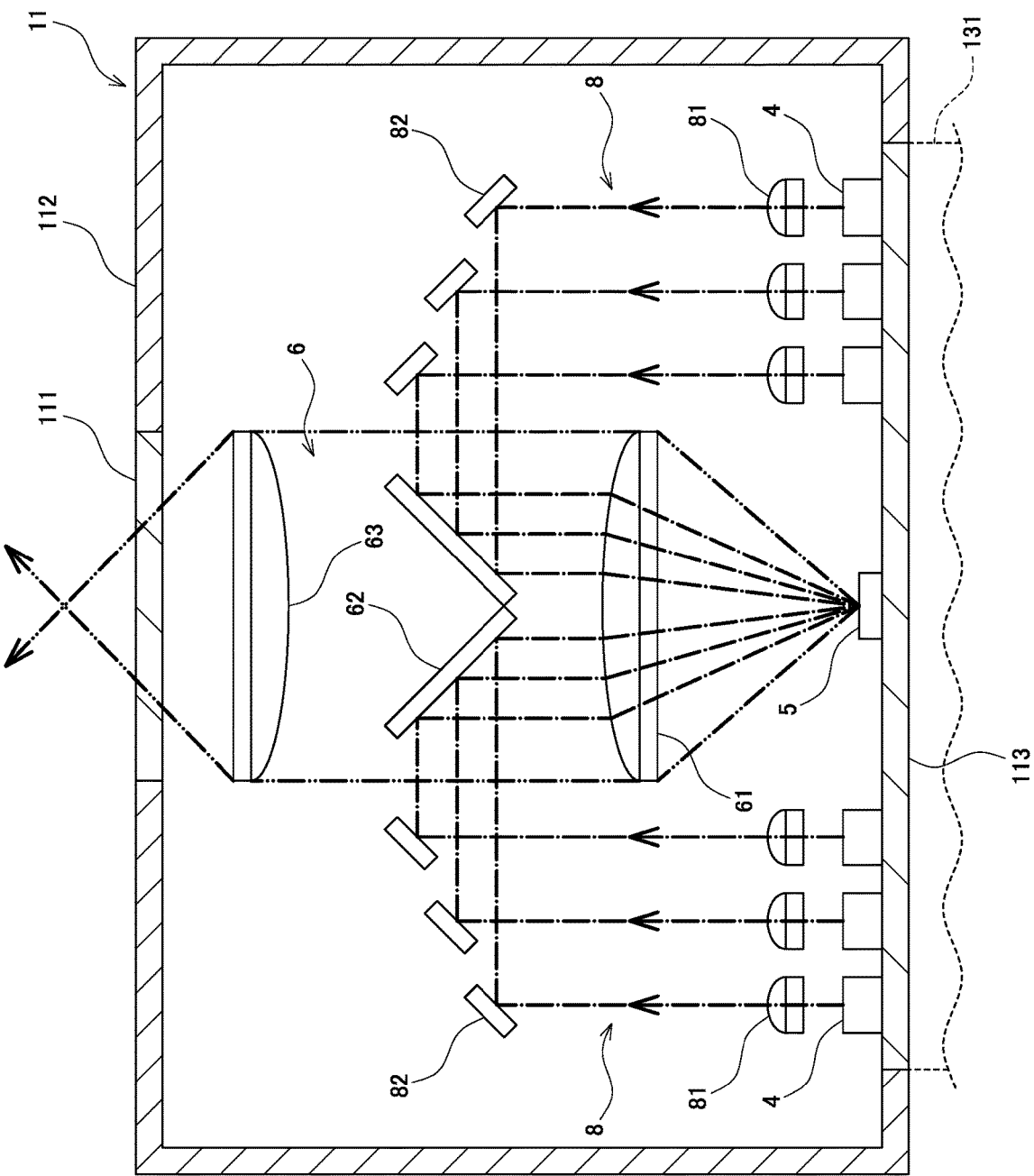
FIG. 4 is an interior view of first casing of floodlight device associated with same embodiment.

As shown in FIG. 3 and FIG. 4, device main body 2 comprises light source(s) 4 which emit light, and fluorescent element 5 which converts a portion of the light incident thereon into fluorescent light that is output therefrom. Furthermore, device main body 2 comprises first optical system 6 on which light output from fluorescent element 5 is incident, and second optical system 7 on which light exiting first optical system 6 is incident and which causes said light to be formed into a collimated light beam that is made to exit therefrom so as to be directed toward the exterior of the floodlight device 1.

Device main body 2 comprises third optical system 8 for causing light exiting light source(s) 4 to be incident on fluorescent element 5 by way of first optical system 6. Furthermore, device main body 2 comprises light blocking body 9 which is arranged between first optical system 6 and second optical system 7, and drive unit 10 which drives second optical system 7 so as to change the diameter of the light that is projected from floodlight device 1.

Device main body 2 comprises first casing 11 which houses light source(s) 4, fluorescent element 5, first optical system 6, and third optical system 8; and second casing 12 which houses second optical system 7, light blocking body 9, and drive unit 10. Furthermore, device main body 2 comprises heat dissipating unit 13 which causes heat produced by light source(s) 4 to be dissipated to the exterior of first casing 11, and third casing 14 which houses heat dissipating unit 13.

Light source 4 is a solid-state light source element 4 (e.g., LED or semiconductor laser). In accordance with the present embodiment, light source 4 is a light-emitting element that emits laser light (e.g., semiconductor laser) 4. Note that light-emitting element 4 may be anything so long as it is an element that emits laser light. Furthermore, a plurality of (six at FIG. 3 and FIG. 4) light sources 4 may be provided.

In accordance with the present embodiment, light source 4 emits blue light (e.g., light of wavelength 400 nm to 470 nm). Furthermore, because light source(s) 4 are light-emitting element(s) 4 that emit laser light, light projected from floodlight device 1 is light of high output power. For example, maximum light intensity of the light projected from floodlight device 1 might be not less than 30,000,000 cd, is preferably not less than 35,000,000 cd, and is more preferably not less than 40,000,000 cd.

Third optical system 8 comprises lens 81 on which light exiting light source(s) 4 is incident, and mirror 82 which reflects light exiting lens 81. Furthermore, lens 81 may be a condensing lens that causes light incident thereon to exit therefrom as a convergent light beam, or may be a collimating lens that causes light incident thereon to exit therefrom as a collimated light beam.

First optical system 6 comprises first lens 61, dichroic mirror 62, and second lens 63. At FIG. 4, note that the alternating long and short chain line indicates light that exits light sources 4 and is incident on fluorescent element 5 (the optical axes of light emitted from respective light sources 4). Furthermore, at FIG. 3 and FIG. 4 (and the same is true of FIG. 5), the double-dash chain line indicates light output from fluorescent element 5.

Dichroic mirror 62 reflects a first polarized light component (e.g., s-polarized light component), and transmits a second polarized light component (e.g., p-polarized light component). In addition, light emitted from light sources 4 is here taken to be linearly polarized laser light made up of only the first polarized light component. Accordingly, all of the light that exits third optical system 8 will be reflected by dichroic mirror 62. In addition, after passing through first lens 61, said light is incident on fluorescent element 5.

In addition, after being output from fluorescent element 5, light which has passed through the peripheral portion of first lens 61 is incident on second lens 63 without being incident on dichroic mirror 62. Furthermore, after being output from fluorescent element 5, light which has passed through the central portion of first lens 61 is incident on dichroic mirror 62, following which only the light that is transmitted through dichroic mirror 62 is incident on second lens 63.

It so happens that light which is output from fluorescent element 5, because it has been subjected to scattering, has not only the first polarized light component but also the second polarized light component. Accordingly, of the light which is incident on dichroic mirror 62, the first polarized light component is reflected by dichroic mirror 62, and the second polarized light component is transmitted through dichroic mirror 62.

Furthermore, first lens 61 is a collimating lens on which divergent light exiting fluorescent element 5 is incident and which causes said divergent light to be made into a collimated light beam that is made to exit therefrom, and second lens 63 is a converging lens on which the collimated light beam exiting first lens 61 is incident and which causes said collimated light beam to be made into a convergent light beam that is made to exit therefrom. Accordingly, first optical system 6 is a condensing optical system that causes light which is incident thereon to exit therefrom as a convergent light beam.

Fluorescent element 5 has a phosphor that converts excitation light into fluorescent light. In accordance with the present embodiment, the phosphor is formed from a YAG-type crystalline material and causes blue light which is excitation light that exits light sources 4 to be converted into yellow-green fluorescent light (e.g., light having a broad visible-region spectrum over the range of wavelengths 450 nm to 800 nm, with a peak at a wavelength of 525 nm to 575 nm).

Fluorescent element 5 converts a portion of the light which is incident thereon into fluorescent light by means of the phosphor. Accordingly, the light that is output from fluorescent element 5 includes fluorescent light which has been converted by fluorescent element 5, and unconverted light (light that is still excitation light) which has not been converted by fluorescent element 5. In accordance with the present embodiment, the light that is output from fluorescent element 5 (i.e., the light that is projected from floodlight device 1) is the white light that results from combination of the yellow-green light which is fluorescent light and the blue light which is unconverted light.

First casing 11 comprises light transmitting unit 111 which transmits light, light blocking unit 112 which blocks light, and heat transfer unit 113 which causes heat produced by light sources 4 and fluorescent element 5 to be transferred by thermal conduction to heat dissipating unit 13. In addition, light exiting second lens 63 of first optical system 6 is made to exit first casing 11 as a result of having been transmitted through light transmitting unit 111.

Heat dissipating unit 13 comprises heat sink 131 which has a plurality of fins, and fan 132 which causes circulation of outside air. In addition, heat dissipating unit 13 is arranged at the exterior of first casing 11 and second casing 12. As a result, heat dissipating unit 13 causes heat produced by light sources 4 and fluorescent element 5 to be discharged to the exterior of first casing 11 and second casing 12 by way of heat transfer unit 113.

Light blocking body 9 comprises light blocking unit 91 which blocks light, and optical path unit 92 through which light passes. Optical path unit 92 is an opening in accordance with the present embodiment, but it might also be formed from a translucent material. In addition, optical path unit 92 is arranged at the location of the focus (including not only the location of the exact focus but also locations at which there is an approximate focus) of first optical system 6 (and more specifically, second lens 63) which is a condensing optical system. As a result, light that exits first optical system 6 passes through optical path unit 92 and is thereafter incident on second optical system 7.

Furthermore, the locus of optical path unit 92 is larger than the optical output locus of fluorescent element 5. Note that the outside edge of the "optical output locus of fluorescent element 5" might, for example, be that location at the surface of fluorescent element 5 at which intensity of the light output from fluorescent element 5 is $e^{-2}$ (=0.1353) of the maximum value thereat.

Note that because first optical system 6 is a condensing optical system, the light that exits first optical system 6 converges until it reaches the focal point and thereafter diverges. In addition, second optical system 7 is arranged at a location separated from first optical system 6 so that the light which exits first optical system 6 will be divergent light when it is incident thereon.

Furthermore, second optical system 7 comprises lens 71. In addition, lens 71 causes divergent light incident thereon after passing through optical path unit 92 of light blocking body 9 to exit therefrom as a collimated light beam. Lens 71 might, for example, be a collimating lens or a Fresnel lens.

Drive unit 10 causes lens 71 of second optical system 7 to move in the direction in which light incident on said lens 71 is traveling (the direction of the optical axis of the light incident thereon, which is the direction indicated by the arrow drawn in broken line at FIG. 3 (the vertical direction in FIG. 3)). Because this causes the locus of the light which is incident on lens 71 to change, it will cause the diameter of the collimated light beam that exits lens 71 (i.e., the light that is projected from floodlight device 1) to change.

Second casing 12 comprises light blocking unit 122 which blocks light and light projecting unit 121 which transmits light for causing light to be projected so as to be directed toward the exterior of floodlight device 1. Furthermore, second casing 12 comprises open portion 123 to allow circulation of air between the interior and the exterior.

Open portion 123 is arranged so as to face the direction of gravity. More specifically, when floodlight device 1 projects light straight up (see FIG. 2), open portion 123 is arranged at a location at the bottom face of second casing 12. This being the case, when floodlight device 1 projects light diagonally upward (see FIG. 1), open portion 123 will be arranged so as to face diagonally downward; and when floodlight device 1 projects light straight up (see FIG. 2), open portion 123 will be arranged so as to face straight down.

It so happens that the volume at the interior of first casing 11 is less than the volume at the interior of second casing 12. In addition, a portion of first casing 11 is arranged at the interior of second casing 12. Moreover, the hermeticity of first casing 11 is greater than the hermeticity of second casing 12.

For example, it is preferred that the hermeticity of first casing 11 be such that the degree of protection as defined by JIS (Japanese Industrial Standard) C0920 and IEC (International Electrotechnical Commission) 60529 is not less than IP66. Moreover, it is more preferred that the hermeticity of first casing 11 be not less than IP67, and still more preferred that this be IP68.

Note that the first characteristic number (first digit) of the IP code indicates the degree of protection with respect to the human body and solid objects. For example, a "6" at the first characteristic number of the IP code indicates dust-resistance (no ingress by dust).

Furthermore, the second characteristic number (second digit) of the IP code indicates the degree of protection against ingress by water. For example, a "6" at the second characteristic number of the IP code indicates water-resistance (no harmful effect despite direct exposure to powerful jets of water coming from any direction or waves), a "7" thereat indicates waterproofing (no harmful effect despite immersion in water at a prescribed pressure for a prescribed time), and an "8" thereat indicates underwater use (suitable for continuous use underwater under conditions specified by the manufacturer; in principle, completely sealed construction).

Accordingly, "IP66" indicates "dust-resistance" as well as "water-resistance". Furthermore, "IP67" indicates "dust-resistance" as well as "waterproofing"; "IP68" indicates "dust-resistance" as well as "underwater use".

Constitution of floodlight device 1 associated with the present embodiment is as described above; action of the respective optical systems 6, 7 at floodlight device 1 associated with the present embodiment is described below with reference to FIG. 5.

Figure 5:
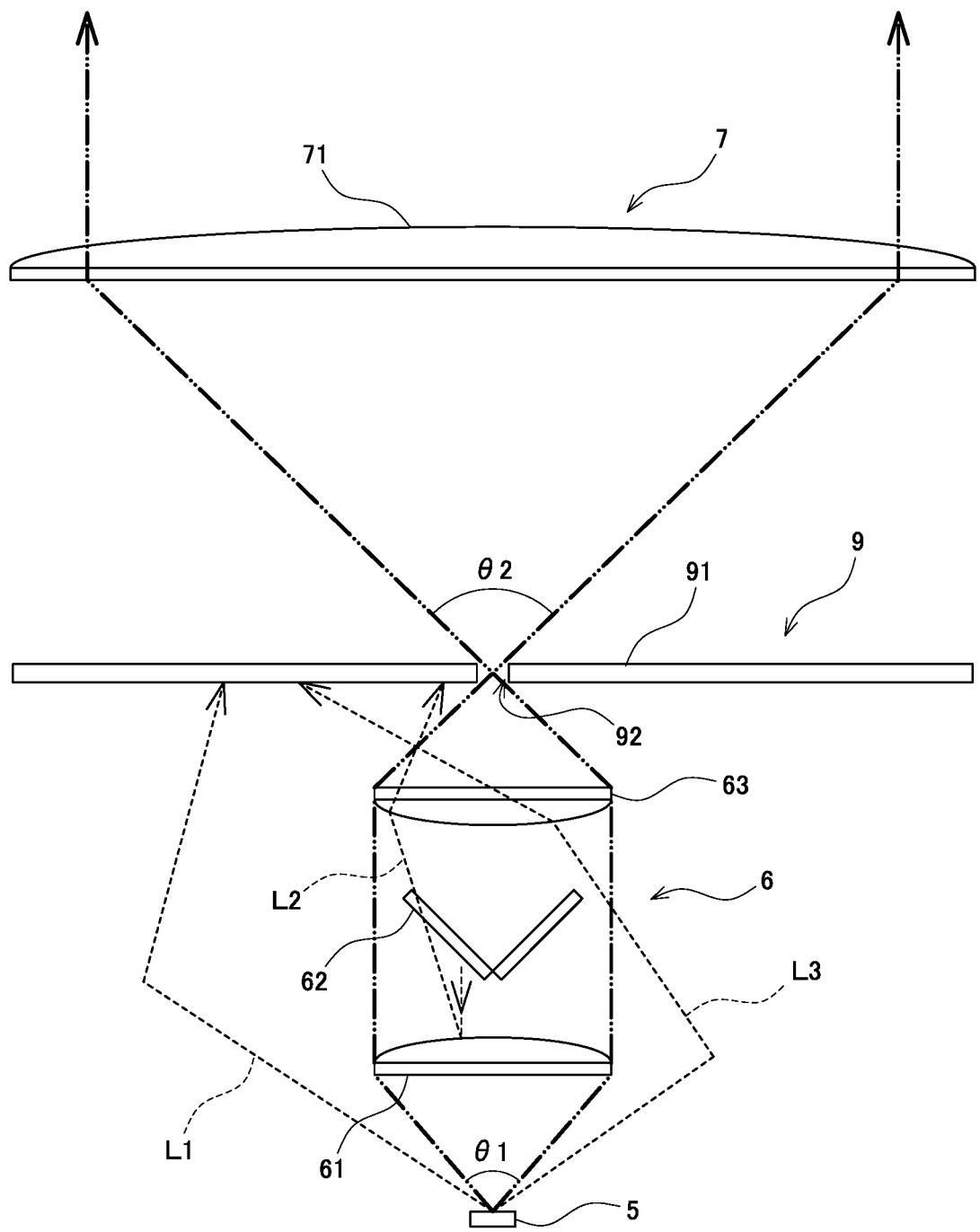
FIG. 5 is a drawing showing a situation such as might exist with the light at the floodlight device associated with same embodiment.

As shown in FIG. 5, divergence angle θ2 of light incident on second optical system 7 is greater than divergence angle θ1 of light incident on first optical system 6. This makes it possible for the optical path between first optical system 6 and second optical system 7 that will cause the locus of the light that is incident on second optical system 7 (more specifically, lens 71), i.e., the light which is projected from floodlight device 1, to be a prescribed size to be made short. Accordingly, this makes it possible, for example, to achieve a device that is compact in size.

Furthermore, light L1 that has been output from fluorescent element 5 and is directed at second optical system 7 without having passed through first optical system 6 might, for example, be blocked by light blocking body 9. Moreover, even light L2, L3 that has passed through first optical system 6 might be blocked by light blocking body 9 if it is unnecessary. Light L2, L3 that did not exit first lens 61 of first optical system 6 as a collimated light beam might also, for example, be blocked by light blocking body 9.

As such light L2, L3, light L2 reflected by first lens 61 upon being incident on first lens 61 after being reflected by dichroic mirror 62, light L3 scattered upon being incident on fluorescent element 5, and so forth may be cited as examples. This will, for example, make it possible to cause the light which is projected from floodlight device 1 to definitely be a collimated light beam.

Furthermore, light output from fluorescent element 5 is made to converge by means of first optical system 6. At such time, light output from the optical output locus of fluorescent element 5 is approximately the same size at the location of the focus of first optical system 6 as it was at the optical output locus of fluorescent element 5. Because the locus of optical path unit 92 at light blocking body 9 is therefore larger than the optical output locus of fluorescent element 5, all of the light which is output from the optical output locus of fluorescent element 5 is able to pass through optical path unit 92. As a result, it is possible, for example, to suppress decrease in optical efficiency of the device due to light blocking body 9.

As it happens, the light emitted from LEDs is such that these are so-called plane light sources. Accordingly, in the context of a constitution in which the light source(s) are LED(s), it will be impossible to cause the light to come together on a single point, and it will be impossible to obtain a high-quality collimated light beam (light in which the rays are highly parallel). To obtain a high-quality collimated light beam, one might therefore contemplate employment of a strategy in which, for example, the diameter of optical path unit 92 associated with the present embodiment is decreased; however, were this to be done, there would be a reduction in the amount of light that passes through optical path unit 92, causing a marked reduction in light intensity.

In this regard, a constitution in accordance with the present embodiment is the combination of light-emitting elements 4 which are point light sources at which light sources 4 emit laser light, and fluorescent element 5 which outputs fluorescent light produced by conversion of at least a portion of the light from said light-emitting elements 4. This makes it possible to cause the light that is emitted to come together on a single point, and makes it possible to obtain a high-quality collimated light beam. Accordingly, it will be possible to project light over a long distance without causing it to spread out.

Action of the respective casings 11, 12 at floodlight device 1 associated with the present embodiment is described below.

For example, even where a construction has been adopted that will increase the hermeticity of the casing(s), the greater the volume at the interior of the casing the more likely it will be that slight gaps and so forth will form. In addition, if exterior air enters by way of such gaps, dust will enter the interior of the casing, and where humidity of the exterior air that has entered thereinto is high, there will be occurrence of condensation at the interior of the casing.

Moreover, where dust adheres to solid-state light source element 4 constituting light source 4, there are cases in which it gets burned; and where condensed water enters solid-state light source element 4, there are cases in which it causes damage to solid-state light source element 4. Furthermore, where condensed water enters fluorescent element 5, there are cases in which light of a prescribed intensity will not be output from fluorescent element 5.

Of components 4 through 9 which must be housed within casings 11, 12, light source 4, fluorescent element 5, first optical system 6, and third optical system 8 are therefore housed within first casing 11, while second optical system 7 and light blocking body 9 are housed within second casing 12. In addition to which, because the volume at the interior of first casing 11 is less than the volume at the interior of second casing 12, it is possible to cause the hermeticity of first casing 11 to be higher. Accordingly, it is possible to suppress occurrence of a situation in which respective components 4 through 6 and 8, which are housed at the interior of first casing 11, are put in communication with exterior air.

As described above, the floodlight device 1 of the embodiment includes: a light-emitting element 4 that emits laser light; a fluorescent element 5 on which light emitted from the light-emitting element 4 is incident and which converts at least a portion of said light into fluorescent light that is output therefrom; a first optical system 6 on which light output from the fluorescent element 5 is incident; and a second optical system 7 on which light exiting the first optical system 6 is incident and which causes said light to be made into a collimated light beam that is made to exit therefrom so as to be directed toward the exterior of the device 1; wherein a divergence angle θ2 of light incident on the second optical system 7 is greater than a divergence angle θ1 of light incident on the first optical system 6.

In accordance with such constitution, light-emitting elements 4 emit laser light, and the light emitted by light-emitting elements 4 is incident on fluorescent element 5. In addition, fluorescent element 5 converts at least a portion of the light that is incident thereon into fluorescent light which is output therefrom, and the light which is output from fluorescent element 5 is incident on first optical system 6. Light that exits first optical system 6 is thereafter incident on second optical system 7, and second optical system 7 causes a collimated light beam to exit therefrom so as to be directed toward the exterior of the device 1.

Because light sources 4 are thus light-emitting elements 4 that emit laser light, the life of light sources 4 may, for example, be made long as compared with a constitution in which light source 4 is a discharge lamp. Moreover, because light sources 4 are light-emitting elements 4 that emit laser light, output (intensity, illuminance, etc.) of the light projected from floodlight device 1 may, for example, be made high as compared with a constitution in which light source 4 is an LED.

It so happens that divergence angle θ2 of light incident on second optical system 7 is greater than divergence angle θ1 of light incident on first optical system 6. That is, first optical system 6 causes light which is output from fluorescent element 5 and incident thereon to be made to diverge greatly over a short optical path. This makes it possible for the optical path between first optical system 6 and second optical system 7 that will cause the light which is projected from floodlight device 1 to be a prescribed size to be made short.

Further, in the floodlight device 1 of the embodiment, the first optical system 6 is a condensing optical system that causes light which is incident thereon to exit therefrom as a convergent light beam; and the second optical system 7 is arranged at a location separated from the first optical system 6 in such fashion as to cause light exiting the first optical system 6 to be a divergent light beam when incident on the second optical system 7.

In accordance with such constitution, first optical system 6 is a condensing optical system that causes light which is incident thereon to exit therefrom as a convergent light beam. In addition, because second optical system 7 is arranged at a location separated from first optical system 6, the light that exits first optical system 6 will be divergent light when it is incident on second optical system 7. As a result, because the light that exits first optical system 6 will have a focus, this will permit facilitation of the design of the device, for example.

Further, the floodlight device 1 of the embodiment further includes, a light blocking body 9 that blocks light that is output from the fluorescent element 5 and that is directed at the second optical system 7 without having passed through the first optical system 6; wherein the light blocking body 9 comprises an optical path unit 92 for allowing light that exits the first optical system 6 to pass therethrough and be incident on the second optical system 7.

In accordance with such constitution, light exiting first optical system 6 passes through optical path unit 92 of light blocking body 9 and is incident on second optical system 7. In addition, light that is output from fluorescent element 5 and that is directed at second optical system 7 without having passed through first optical system 6 is blocked by light blocking body 9. This makes it possible to suppress occurrence of a situation in which said light is incident on second optical system 7.

Further, in the floodlight device 1 of the embodiment, the optical path unit 92 is arranged at a location of a focus of the first optical system 6; and a locus of the optical path unit 92 is larger than an optical output locus of the fluorescent element 5.

In accordance with such constitution, optical path unit 92 is arranged at the location of the focus of first optical system 6, and the locus of optical path unit 92 is larger than the optical output locus of fluorescent element 5. This makes it possible for light output from the optical output locus of fluorescent element 5 to pass through optical path unit 92 without being blocked by light blocking body 9.

Further, the floodlight device 1 of the embodiment includes: a first casing 11 that houses at least the light-emitting element 4 (in the present embodiment, light-emitting element 4, fluorescent element 5, first optical system 6, and third optical system 8); and a second casing 12 that houses at least the second optical system? (in the present embodiment, second optical system 7 and light blocking body 9); wherein volume at the interior of the first casing 11 is less than volume at the interior of the second casing 12; and hermeticity of the first casing 11 is greater than hermeticity of the second casing 12.

That is, the floodlight device 1 of the embodiment includes: a solid-state light source element 4 that emits light; an optical element (in the present embodiment, second optical system 7 and light blocking body 9) on which light emitted from the solid-state light source element 4 is incident and which causes said light to exit therefrom so as to be directed toward the exterior of the device 1; a first casing 11 that houses the solid-state light source element 4; and a second casing 12 that houses the optical element (in the present embodiment, second optical system 7 and light blocking body 9); wherein volume at the interior of the first casing 11 is less than volume at the interior of the second casing 12; and hermeticity of the first casing 11 is greater than hermeticity of the second casing 12.

In accordance with such constitution, first casing 11 houses solid-state light source elements 4, and second casing 12 houses optical elements (in the present embodiment, second optical system 7 and light blocking body 9). In addition, the volume at the interior of first casing 11 is less than the volume at the interior of second casing 12, and the hermeticity of first casing 11 is greater than the hermeticity of second casing 12. Because this makes it possible to increase the hermeticity of first casing 11, it is possible to suppress occurrence of a situation in which solid-state light source elements 4 are put in communication with exterior air.

Further, in the floodlight device 1 of the embodiment, at least a portion of the first casing 11 is arranged at the interior of the second casing 12.

In accordance with such constitution, because at least a portion of first casing 11 is arranged at the interior of second casing 12, at least said portion is covered by second casing 12. As a result, first casing 11 will be put in communication with exterior air by way of second casing 12. Accordingly, because this makes it possible to further increase the hermeticity of first casing 11, it is possible to suppress occurrence of a situation in which solid-state light source elements 4 are put in communication with exterior air.

Further, the floodlight device 1 of the embodiment further includes: a heat dissipating unit 13 that causes heat produced by the light-emitting element 4 to be discharged to the exterior of the first casing 11; wherein the heat dissipating unit 13 is arranged at the exterior of the second casing 12.

In accordance with such constitution, heat produced by solid-state light source elements 4 is discharged to the exterior of first casing 11 by means of heat dissipating unit 13. In addition, because heat dissipating unit 13 is arranged at the exterior of second casing 12, heat produced by solid-state light source elements 4 is discharged to the exterior of second casing 12 by means of heat dissipating unit 13.

Accordingly, even if dissipation of heat by heat dissipating unit 13 were to be terminated when solid-state light source elements 4 are switched from their outputting state to their non-outputting state, it will still be possible to suppress change in temperature at the interior of second casing 12. As a result, even if high-humidity exterior air should enter the interior of second casing 12 when solid-state light source elements 4 are in their outputting state, for example, it will be possible to suppress occurrence of condensation at the interior of second casing 12 when solid-state light source elements 4 are switched from their outputting state to their non-outputting state.

Further, in the floodlight device 1 of the embodiment, the second casing 12 comprises an open portion 123 for allowing circulation of air between the interior of the second casing 12 and the exterior of the second casing 12; and the open portion 123 is arranged so as to face the direction of gravity.

In accordance with such constitution, because open portion 123 causes circulation of air between the interior and the exterior of second casing 12, it is possible for the interior of second casing 12 to reflect the environment at the exterior of second casing 12. Furthermore, because open portion 123 is arranged so as to face the direction of gravity, it is, for example, possible to suppress occurrence of a situation in which rainwater falling in the direction of gravity enters the interior of second casing 12 by way of open portion 123.

Furthermore, even if, for example, condensation were to occur at the interior of second casing 12, it will be possible for the condensed water to be discharged to the exterior of second casing 12 by way of open portion 123.

The floodlight device is not limited to the configuration of the embodiment described above, and the effects are not limited to those described above. It goes without saying that the floodlight device can be variously modified without departing from the scope of the subject matter of the present invention. For example, the constituents, methods, and the like of various modified examples described below may be arbitrarily selected and employed as the constituents, methods, and the like of the embodiments described above, as a matter of course.

The constitution of floodlight device 1 associated with the foregoing embodiment is such that first optical system 6 comprises first lens 61, dichroic mirror 62, and second lens 63. However, the floodlight device is not limited to such constitution. For example, it is also possible to adopt a constitution in which first optical system 6 has one lens. In addition, light output from fluorescent element 5 might, for example, be incident on said one lens, and said one lens might cause said light to exit therefrom as a convergent light beam that is directed toward second optical system 7.

Furthermore, the constitution of floodlight device 1 associated with the foregoing embodiment is such that second optical system 7 comprises one lens 71. However, the floodlight device is not limited to such constitution. For example, it is also possible to adopt a constitution in which second optical system 7 comprises a plurality of lenses, and it is also possible to adopt a constitution in which second optical system 7 comprises not only lens(es) but also reflecting member(s) (e.g., mirror(s)).

Furthermore, the constitution of floodlight device 1 associated with the foregoing embodiment is such that first optical system 6 is a condensing optical system that causes light which is incident thereon to exit therefrom as a convergent light beam. However, the floodlight device is not limited to such constitution. For example, it is also possible to adopt a constitution in which first optical system 6 is a divergent optical system that causes light which is incident thereon to exit therefrom as a divergent light beam. More specifically, it is also possible to adopt a constitution in which first optical system 6 is such that second lens 63 is a concave lens that is a diverging lens. In the context of such constitution, light blocking body 9 would normally not be provided.

Furthermore, the constitution of floodlight device 1 associated with the foregoing embodiment is such that fluorescent element 5 converts a portion of the light that is incident thereon into fluorescent light which is output therefrom. However, the floodlight device is not limited to such constitution. For example, it is also possible to adopt a constitution in which fluorescent element 5 converts all of the light that is incident thereon into fluorescent light which is output therefrom.

Furthermore, the constitution of floodlight device 1 associated with the foregoing embodiment is such that fluorescent element 5 is a reflecting element (a constitution in which the direction in which light incident on fluorescent element 5 travels and the direction in which light output from fluorescent element 5 travels are oppositely directed). However, the floodlight device is not limited to such constitution. For example, it is also possible to adopt a constitution in which fluorescent element 5 is a transmitting element (a constitution in which the direction in which light incident on fluorescent element 5 travels and the direction in which light output from fluorescent element 5 travels are in the same direction).

Furthermore, the constitution of floodlight device 1 associated with the foregoing embodiment is such that fluorescent element 5 is stationary with respect to first casing 11. However, the floodlight device is not limited to such constitution. For example, it is also possible to adopt a constitution in which fluorescent element 5 rotates relative to first casing 11.

Furthermore, the constitution of floodlight device 1 associated with the foregoing embodiment is such that first casing 11 houses light sources 4, fluorescent element 5, first optical system 6, and third optical system 8. However, the floodlight device is not limited to such constitution. For example, it is also possible to adopt a constitution in which first casing 11 houses only light sources 4 and fluorescent element 5, and it is also possible to adopt a constitution in which first casing 11 houses only light sources 4. In other words, it is sufficient that the constitution be such that first casing 11 houses at least solid-state light source elements 4.

Furthermore, the constitution of floodlight device 1 associated with the foregoing embodiment is such that the optical elements housed by second casing 12 are second optical system 7 (lens 71) and light blocking body 9. However, the floodlight device is not limited to such constitution. For example, the optical element(s) housed by second casing 12 may be only second optical system 7 (lens 71), or may be only light blocking body 9, or may be other element(s).

Furthermore, the constitution of floodlight device 1 associated with the foregoing embodiment is such that a portion of first casing 11 is arranged at the interior of second casing 12. However, the floodlight device is not limited to such constitution. It is also possible, for example, to adopt a constitution in which all of first casing 11 is arranged at the interior of second casing 12, and it is also possible, for example, to adopt a constitution in which all of first casing 11 is arranged at the exterior of second casing 12.

Furthermore, the constitution of floodlight device 1 associated with the foregoing embodiment is such that heat dissipating unit 13 comprises heat sink 131 and fan 132. However, the floodlight device is not limited to such constitution. For example, it is also possible to adopt a constitution in which heat dissipating unit 13 comprises a Peltier element.

Furthermore, the constitution of floodlight device 1 may be such that second casing 12 comprises a cover that covers open portion 123. In addition, such cover might, for example, be in the form of a filter that does not allow dust or water to pass therethrough but does allow air to pass therethrough, or might be in the form of a lid through which not only dust and water but also air is unable to pass.

Furthermore, the constitution of floodlight device 1 may be such that light blocking body 9 comprises a reflecting layer at the surface thereof. In accordance with such constitution, even where sunlight is incident on light blocking body 9 by way of light blocking unit 112 and lens 71, for example, because light blocking body 9 will reflect said sunlight, it will be possible to suppress occurrence of a situation in which light blocking body 9 overheats. Note that said reflecting layer is constituted so as to reflect at least 50% of sunlight, being formed, for example, by a white-colored coating.

REFERENCE SIGNS LIST 1 floodlight device
2 device main body 3 support
4 light source (solid-state light source element, light-emitting element)
5 fluorescent element
6 first optical system
7 second optical system
8 third optical system
9 light blocking body
10 drive unit
11 first casing
12 second casing
13 heat dissipating unit
14 third casing
61 first lens
62 dichroic mirror
63 second lens
71 lens
81 lens
82 mirror
91 light blocking unit
92 optical path unit
111 light transmitting unit
112 light blocking unit
113 heat transfer unit
121 light projecting unit
122 light blocking unit
123 open portion
131 heat sink
132 fan

The invention claimed is:

1. A floodlight device comprising:
a light-emitting element that emits laser light;
a fluorescent element on which light emitted from the light-emitting element is incident and which converts at least a portion of said light into fluorescent light that is output therefrom;
a first optical system on which light output from the fluorescent element is incident; and
a second optical system on which light exiting the first optical system is incident and which causes said light to be made into a collimated light beam that is made to exit therefrom so as to be directed toward the exterior of the device;
wherein
a divergence angle of light incident on the second optical system is greater than a divergence angle of light incident on the first optical system, and
the first optical system includes a lens on which light is first incident after being output from the fluorescent element.

2. The floodlight device according to claim 1 wherein
the first optical system is a condensing optical system that causes light which is incident thereon to exit therefrom as a convergent light beam; and
the second optical system is arranged at a location separated from the first optical system in such fashion as to cause light exiting the first optical system to be a divergent light beam when incident on the second optical system.

3. The floodlight device according to claim 2 further comprising:
a first casing that houses at least the light-emitting element; and
a second casing that houses at least the second optical system;
wherein volume at the interior of the first casing is less than volume at the interior of the second casing; and
hermeticity of the first casing is greater than hermeticity of the second casing.

4. The floodlight device according to claim 3 wherein at least a portion of the first casing is arranged at the interior of the second casing.

5. The floodlight device according to claim 3 further comprising:
a heat dissipating unit that causes heat produced by the light-emitting element to be discharged to the exterior of the first casing;
wherein the heat dissipating unit is arranged at the exterior of the second casing.

6. A floodlight device comprising:
a light-emitting element that emits laser light;
a fluorescent element on which light emitted from the light-emitting element is incident and which converts at least a portion of said light into fluorescent light that is output therefrom;
a first optical system on which light output from the fluorescent element is incident;
a second optical system on which light exiting the first optical system is incident and which causes said light to be made into a collimated light beam that is made to exit therefrom so as to be directed toward the exterior of the device; and
a light blocking body that blocks light that is output from the fluorescent element and that is directed at the second optical system without having passed through the first optical system;
wherein
the light blocking body comprises an optical path unit for allowing light that exits the first optical system to pass therethrough and be incident on the second optical system;
the first optical system is a condensing optical system that causes light which is incident thereon to exit therefrom as a convergent light beam;
the second optical system is arranged at a location separated from the first optical system in such fashion as to cause light exiting the first optical system to be a divergent light beam when incident on the second optical system; and
a divergence angle of light incident on the second optical system is greater than a divergence angle of light incident on the first optical system.

7. The floodlight device according to claim 6 wherein
the optical path unit is arranged at a location of a focus of the first optical system; and
a locus of the optical path unit is larger than an optical output locus of the fluorescent element.

8. The floodlight device according to claim 7 wherein the light blocking body comprises a reflecting layer at a surface thereof.

9. The floodlight device according to claim 6 wherein the light blocking body comprises a reflecting layer at a surface thereof.

10. A floodlight device comprising:
a light-emitting element that emits laser light;
a fluorescent element on which light emitted from the light-emitting element is incident and which converts at least a portion of said light into fluorescent light that is output therefrom;
a first optical system on which light output from the fluorescent element is incident;
a second optical system on which light exiting the first optical system is incident and which causes said light to be made into a collimated light beam that is made to exit therefrom so as to be directed toward the exterior of the device;

a first casing that houses at least the light-emitting element; and a second casing that houses at least the second optical system;

wherein volume at the interior of the first casing is less than volume at the interior of the second casing;

hermeticity of the first casing is greater than hermeticity of the second casing; and a divergence angle of light incident on the second optical system is greater than a divergence angle of light incident on the first optical system.

11. The floodlight device according to claim 10 wherein at least a portion of the first casing is arranged at the interior of the second casing.

12. The floodlight device according to claim 10 further comprising:

a heat dissipating unit that causes heat produced by the light-emitting element to be discharged to the exterior of the first casing;

wherein the heat dissipating unit is arranged at the exterior of the second casing.

13. The floodlight device according to claim 10 wherein the second casing comprises an open portion for allowing circulation of air between the interior of the second casing and the exterior of the second casing; and the open portion is arranged so as to face the direction of gravity.

* * * * *